(12) United States Patent
Go et al.

(10) Patent No.: US 9,171,893 B2
(45) Date of Patent: Oct. 27, 2015

(54) MOTHER SUBSTRATE FOR ORGANIC LIGHT-EMITTING DISPLAY DEVICE AND METHOD OF MANUFACTURING ORGANIC LIGHT-EMITTING DISPLAY DEVICE

(71) Applicant: Samsung Display Co., Ltd., Yongin, Gyeonggi-Do (KR)

(72) Inventors: Jae-Kyung Go, Yongin (KR); So-Ra Kwon, Yongin (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 0 days.

(21) Appl. No.: 14/273,110

(22) Filed: May 8, 2014

(65) Prior Publication Data

US 2015/0179720 A1  Jun. 25, 2015

(30) Foreign Application Priority Data

Dec. 23, 2013 (KR) .................. 10-2013-0161781

(51) Int. Cl.
*H01L 27/32* (2006.01)
*H01L 51/56* (2006.01)

(52) U.S. Cl.
CPC ........ *H01L 27/3258* (2013.01); *H01L 27/3223* (2013.01); *H01L 27/3246* (2013.01); *H01L 27/3248* (2013.01); *H01L 51/56* (2013.01); *H01L 2227/323* (2013.01); *H01L 2251/566* (2013.01)

(58) Field of Classification Search
None
See application file for complete search history.

(56) References Cited

U.S. PATENT DOCUMENTS

| | | | |
|---|---|---|---|
| 7,821,197 B2 | 10/2010 | Lee | |
| 2003/0146694 A1* | 8/2003 | Lee et al. | 313/505 |
| 2003/0160931 A1 | 8/2003 | Jung et al. | |
| 2005/0046346 A1* | 3/2005 | Tsuchiya et al. | 313/509 |
| 2012/0313844 A1* | 12/2012 | Im et al. | 345/76 |

FOREIGN PATENT DOCUMENTS

| | | |
|---|---|---|
| JP | 2007-200846 A | 8/2007 |
| JP | 2011-169984 A | 9/2011 |
| KR | 10-1999-0074690 A | 10/1999 |
| KR | 10-2003-0050361 A | 6/2003 |
| KR | 10-2013-0020076 A | 2/2013 |

* cited by examiner

*Primary Examiner* — Khaja Ahmad
(74) *Attorney, Agent, or Firm* — Knobbe, Martens, Olson & Bear, LLP (57) ABSTRACT

A mother substrate for an organic light-emitting display device includes a base substrate, a plurality of display areas arranged in an array on the base substrate, the array having a plurality of rows and a plurality of columns that are perpendicular to the plurality of rows. The mother substrate further includes a plurality of first dummy patterns formed between the plurality of rows of display areas, and a plurality of second dummy patterns formed between the plurality of columns of display areas. The plurality of first dummy patterns are spaced apart from each other by a plurality of cut portions.

17 Claims, 6 Drawing Sheets

MOTHER SUBSTRATE FOR ORGANIC LIGHT-EMITTING DISPLAY DEVICE AND METHOD OF MANUFACTURING ORGANIC LIGHT-EMITTING DISPLAY DEVICE

CROSS-REFERENCE TO RELATED APPLICATIONS

This application claims the benefit of Korean Patent Application No. 10-2013-0161781, filed on Dec. 23, 2013, in the Korean Intellectual Property Office, the disclosure of which is incorporated herein in its entirety by reference.

BACKGROUND

1. Field

The described technology generally relates to a mother substrate for organic light-emitting display device and a method of manufacturing an organic light-emitting display device.

2. Description of the Related Art

Organic light-emitting display devices are self-emissive and include a hole injection electrode and an electron injection electrode, and an organic emission layer (organic EML) formed therebetween. A hole injected from the hole injection electrode and an electrode injected from the electron injection electrode are combined in the organic EML to generate an exiton, and light is emitted when the exiton falls from an excited state to a ground state.

Organic light-emitting display devices do not require a separate light source, are capable of operating with a low voltage, can be lightweight and slim, and are expected to become a next generation display device due to its high quality characteristics such as its wide viewing angle, high contrast, and fast response time.

SUMMARY

One inventive aspect is a mother substrate for an organic light-emitting display device and a method of manufacturing an organic light-emitting display device.

Additional aspects will be set forth in part in the description which follows and, in part, will be apparent from the description, or may be learned by practice of the presented embodiments.

According to another aspect, a mother substrate for an organic light-emitting display device includes a base substrate, a plurality of display areas arranged in an array on the base substrate, the array having a plurality of rows and a plurality of columns that are perpendicular to the plurality of rows. The mother substrate further includes a plurality of first dummy patterns formed between the plurality of rows of display areas, and a plurality of second dummy patterns formed between the plurality of columns of display areas. The plurality of first dummy patterns are spaced apart from each other by a plurality of cut portions.

According to another aspect, a mother substrate for an organic light-emitting display device includes a base substrate having a plurality of display areas defined thereon; and a plurality of first dummy patterns and a plurality of second dummy patterns, which are formed between the plurality of display areas, wherein the plurality of display areas are arranged in an array having a plurality of rows and a plurality of columns, wherein the plurality of first dummy patterns are parallel to the plurality of rows, and the plurality of second dummy patterns are parallel to the plurality of columns, and wherein each of the plurality of first dummy patterns includes a plurality of cut portions.

Cut portions of the plurality of cut portions which are formed in a center portion of the base substrate may be larger than cut portions of the plurality of cut portions which are formed in side portions of the base substrate.

Each of the plurality of display areas may include a thin-film transistor (TFT), a planarization layer formed on the TFT, and an organic light-emitting device electrically connected to the TFT through the planarization layer, and the plurality of first dummy patterns and the plurality of second dummy patterns may be formed of a same material as the planarization layer.

Each of the plurality of first dummy patterns may include a first partition wall and a second partition wall that are parallel to each other and are separated from each other by a regular distance.

The first partition wall may include a plurality of first cut portions, and the second partition wall may include a plurality of second cut portions.

The plurality of first cut portions and the plurality of second cut portions may alternate with each other.

Each of the plurality of first dummy patterns may include a plurality of first concave portions formed in a first side surface.

Each of the plurality of first dummy patterns may further include a plurality of second concave portions formed in a second side surface opposite to the first side surface.

The plurality of second concave portions and the plurality of first concave portions may alternate with each other.

The mother substrate for organic light-emitting display device may further include first cutting lines between the plurality of first dummy patterns and the plurality of display areas, and second cutting lines between the plurality of second dummy patterns and the plurality of display areas.

According to another aspect, a method of manufacturing an organic light-emitting display device includes forming a thin-film transistor (TFT) within each of a plurality of display areas defined over a base substrate; forming a planarization layer over the TFT; and forming an organic light-emitting diode (OLED) over the planarization layer, wherein the plurality of display areas are arranged in an array on the base substrate, the array having a plurality of rows and a plurality of columns that are perpendicular to the plurality of rows, and wherein, in the forming of the planarization layer, a plurality of first dummy patterns are formed between the rows of display areas and a plurality of second dummy patterns are formed between the columns of display areas, using the same material as the planarization layer, and wherein the plurality of first dummy patterns are spaced apart from each other by a plurality of cut portions.

According to another aspect, a method of manufacturing an organic light-emitting display device includes operations of forming a thin-film transistor (TFT) within each of a plurality of display areas defined on a base substrate; forming a planarization layer on the TFT; and forming an organic light-emitting device on the planarization layer, wherein the plurality of display areas are arrayed in parallel with each other and thus form a plurality of rows and a plurality of columns, wherein, in the forming of the planarization layer, a plurality of first dummy patterns and a plurality of second dummy patterns are formed between the plurality of display areas, by using the same material as the planarization layer, and wherein each of the plurality of first dummy patterns includes a plurality of cut portions.

The operation of forming the organic light-emitting device may include operations of forming a pixel electrode on the planarization layer, and forming a pixel defining layer on the pixel electrode, in the operation of forming the pixel defining layer, a nozzle unit may generate an insulating layer by spraying an insulating solution on the base substrate while the nozzle unit moves along a first direction, and the insulating layer is patterned, and the plurality of first dummy patterns may be formed in a direction perpendicular to the first direction.

Cut portions of the plurality of cut portions which are formed in a center portion of the base substrate may be larger than cut portions of the plurality of cut portions which are formed in side portions of the base substrate.

Each of the plurality of first dummy patterns may include a first partition wall and a second partition wall that are parallel to each other and are separated from each other by a regular distance.

The first partition wall may include a plurality of first cut portions, and the second partition wall may include a plurality of second cut portions, and the plurality of first cut portions and the plurality of second cut portions may alternate with each other.

Each of the plurality of first dummy patterns may include a plurality of first concave portions formed in a first side surface that faces in a direction opposite to a movement direction of the nozzle unit.

Each of the plurality of first dummy patterns may further include a plurality of second concave portions formed in a second side surface opposite to the first side surface, and the plurality of second concave portions and the plurality of first concave portions may alternate with each other.

The method may further include operations of cutting first cutting lines between the plurality of first dummy patterns and the plurality of display areas, and cutting second cutting lines between the plurality of second dummy patterns and the plurality of display areas.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the described technology are encompassed in the present invention. In the present disclosure, certain detailed explanations of the related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. The drawings described are only schematic and are non-limiting. In the drawings, the size of some of the elements may be exaggerated and not drawn to scale for illustrative purposes.

It will be understood that when each element is referred to as being "on" or "under" another element, each element can be directly on or under another element, or an intervening element may also be present. The references with respect to being "on" or "under" are based on the drawings.

Embodiments will be described with reference to the accompanying drawings, wherein components that are the same as or similar to those of preceding embodiments are designated with the same reference numeral regardless of the figure number, and redundant explanations thereof are omitted. In this regard, the present embodiments may have different forms and should not be construed as being limited to the descriptions set forth herein. Accordingly, the embodiments are merely described below, by referring to the figures, to explain aspects of the described technology. As used herein, the term "and/or" includes any and all combinations of one or more of the associated listed items.

Figure 1:
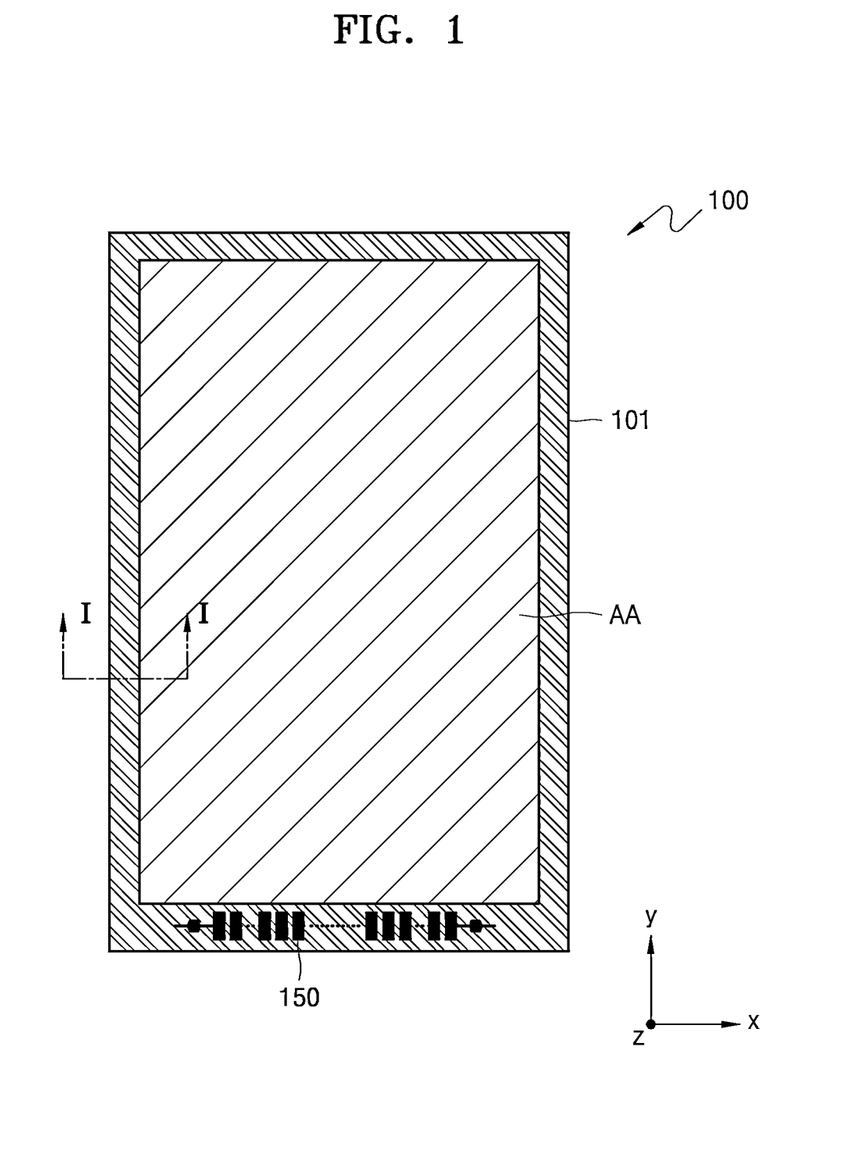
FIG. 1 is a plan view illustrating an organic light-emitting display device according to an embodiment of the present invention.
Figure 2:
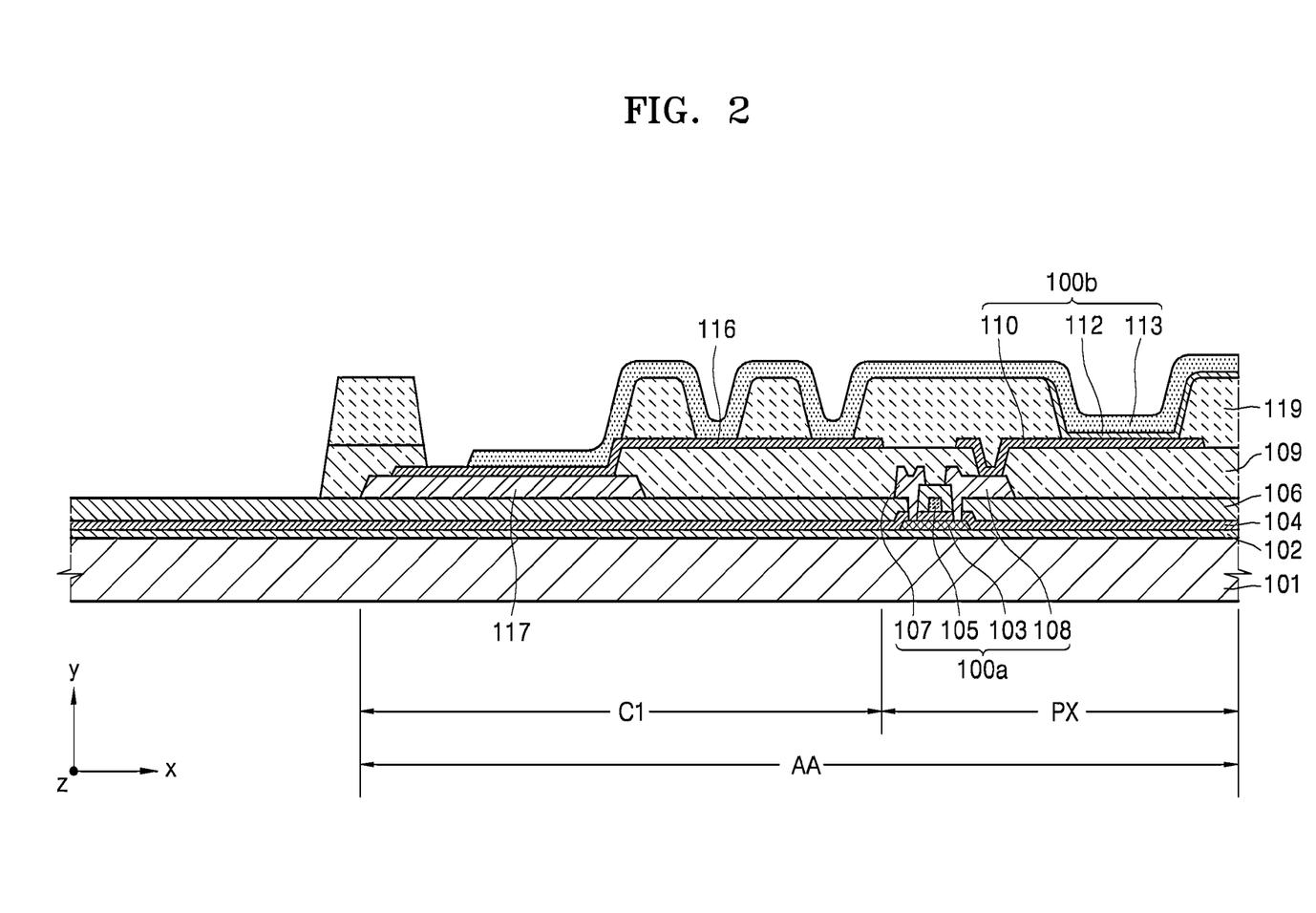
FIG. 2 is a cross-sectional view of the organic light-emitting display device, taken along a line I-I of FIG. 1.

FIG. 1 is a plan view illustrating an organic light-emitting display device 100 according to an embodiment. FIG. 2 is a cross-sectional view of the organic light-emitting display device 100, taken along a line I-I of FIG. 1.

Referring to FIGS. 1 and 2, the organic light-emitting display device 100 may include a substrate 101 that defines a display area AA, and a pixel unit PX and a circuit unit C1 that are formed within the display area AA. A plurality of pad units 150 may be disposed around the display area AA. The pad units 150 may transmit an electric signal from a power supply device (not shown) or a signal generation device (not shown) to the display area AA.

The substrate 101 may be formed of a transparent material. For example, the substrate 101 may be formed of a transparent glass material or a transparent plastic material containing $SiO_2$.

A buffer layer 102 may be formed on the substrate 101. The buffer layer 102 may prevent penetration of foreign substances via the substrate 101 and provide a flat surface on the substrate 101. The buffer layer 102 may be formed of various materials that can provide such functions.

For example, the buffer layer 102 may be a composite layer formed of two or more materials of an inorganic material including silicon oxide, silicon nitride, silicon oxynitride, aluminum oxide, aluminum nitride, titanium oxide, titanium nitride, or the like, and an organic material including polyimide, polyester, acryl, or the like. However, the buffer layer 102 is not an essential element and thus, in some embodiments, the buffer layer 102 may be omitted.

The pixel unit PX and the circuit unit C1 are formed within the display area AA. The pixel unit PX may actually generate a visible ray and may include a thin-film transistor (TFT) 100a and an organic light-emitting diode (OLED) 100b. The circuit unit C1 may have various circuit patterns, e.g., a power supply pattern, a static prevention pattern, and other various circuit patterns.

The TFT 100a may include an active layer 103, a gate electrode 105, a source electrode 107, and a drain electrode 108.

The active layer 103 may be formed of an inorganic semiconductor such as amorphous silicon or polysilicon, an organic semiconductor, or an oxide semiconductor, and may include a source region, a drain region, and a channel region between the source region and the drain region.

A gate insulating layer 104 is formed on the active layer 103. The gate insulating layer 104 may insulate the active layer 103 from the gate electrode 105 and may be formed of an organic material or an inorganic material including SiNx, $SiO_2$, or the like.

The gate electrode 105 is formed on a predetermined area of the gate insulating layer 104. The gate electrode 105 is connected to a gate line (not shown) that applies on/off signals to the TFT 100a.

The gate electrode 105 may contain Au, Ag, Cu, Ni, Pt, Pd, Al, Mo, or an alloy of Al:Nd or Mo:W. However, one or more embodiments of the present invention are not limited thereto, and thus, the gate electrode 105 may be formed of various materials, in consideration of a design condition.

An interlayer insulating layer 106 is formed on the gate electrode 105. The interlayer insulating layer 106 is disposed between the gate electrode 105 and the source electrode 107, and between the gate electrode 105 and the drain electrode 108 so as to provide insulation therebetween. The interlayer insulating layer 106 may be formed of an inorganic material including SiNx, $SiO_2$, or the like.

The source electrode 107 and the drain electrode 108 are formed on the interlayer insulating layer 106. The source electrode 107 and the drain electrode 108 may include one or more metal materials selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The interlayer insulating layer 106 and the gate insulating layer 104 include holes for exposing a source region and a drain region of the active layer 103, and the source electrode 107 and the drain electrode 108 may contact the source region and the drain region of the active layer 103, respectively, via the holes.

While FIG. 1 illustrates the top gate type TFT 100a that sequentially includes the active layer 103, the gate electrode 105, the source electrode 107, and the drain electrode 108, one or more embodiments of the present invention are not limited thereto. Thus, the gate electrode 105 may be formed below the active layer 103.

The TFT 100a is electrically connected to the OLED 100b so as to drive the OLED 100b, and is covered by a planarization layer 109. For example, the planarization layer 109 is positioned between the TFT 100a and the OLED 100b.

The planarization layer 109 may be formed of an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof. The planarization layer 109 may be formed as a multi-stack including the inorganic insulating layer and the organic insulating layer.

The OLED 100b may be formed on the planarization layer 109, and may include a pixel electrode 110, a common electrode 113, and an intermediate layer 112 interposed between the pixel electrode 110 and the common electrode 113.

The pixel electrode 110 may be formed on the planarization layer 109 and may be electrically connected to the drain electrode 108 through the planarization layer 109.

The pixel electrode 110 may be a reflective electrode, and may include a reflective layer formed of Ag, Mg, Al, Pt, Pd, Au, Ni, Nd, Ir, Cr or a compound including any combination thereof, and a transparent or translucent electrode layer formed on the reflective layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A pixel defining layer 119 formed of an insulating material is formed on the pixel electrode 110. The pixel defining layer 119 may be formed of an organic insulating material selected from the group consisting of polyimide, polyamide, aryl resin, benzocyclobutane, and phenol resin. The pixel defining layer 119 defines a region of the intermediate layer 112 by exposing a predetermined region of the pixel electrode 110, and the intermediate layer 112 including an organic emission layer (organic EML) (not shown) is disposed in the exposed region.

The organic EML included in the intermediate layer 112 may be a small-molecule organic layer or a polymer organic layer. In addition to the organic EML, the intermediate layer 112 may selectively further include a functional layer such as a hole transport layer (HTL), a hole injection layer (HIL), an electron transport layer (ETL), an electron injection layer (EIL), or the like.

The common electrode 113 may be a transparent or translucent electrode, and may be formed of a metal thin layer having a low work function and including Li, Ca, LiF/Ca, LiF/Al, Al, Ag, Mg or a compound of any of these. Also, an auxiliary electrode layer or a bus electrode, which is formed of a transparent electrode forming material such as ITO, IZO, ZnO or $In_2O_3$, may be further formed on the metal thin layer.

Thus, the common electrode 113 may transmit light emitted from the organic EML included in the intermediate layer 112. For example, the light emitted from the organic EML may be directly emitted toward the common electrode 113 or may be reflected from the pixel electrode 110 (e.g., formed as the reflective electrode) and then may be transmitted toward the common electrode 113.

However, the organic light-emitting display device 100 according to the present embodiment is not limited to a top-emission type organic light-emitting display device. In another embodiment, the organic light-emitting display device 100 may be a bottom-emission type organic light-emitting display device in which light from the organic EML is emitted toward the substrate 101. In such an embodiment, the pixel electrode 110 may be formed as a transparent or translucent electrode, and the common electrode 113 may be formed as a reflective electrode. In yet another embodiment, the organic light-emitting display device 100 may be a dual-emission type organic light-emitting display device in which light is emitted toward and away from the substrate 101.

The circuit unit C1 may include a circuit line 116, a power line 117, and various circuit patterns such as a static prevention pattern, etc. The circuit line 116 may be formed of the same material as the pixel electrode 110 and may be connected to the common electrode 113. The power line 117 may be formed of the same material as the source electrode 107 or the drain electrode 108.

Figure 3:
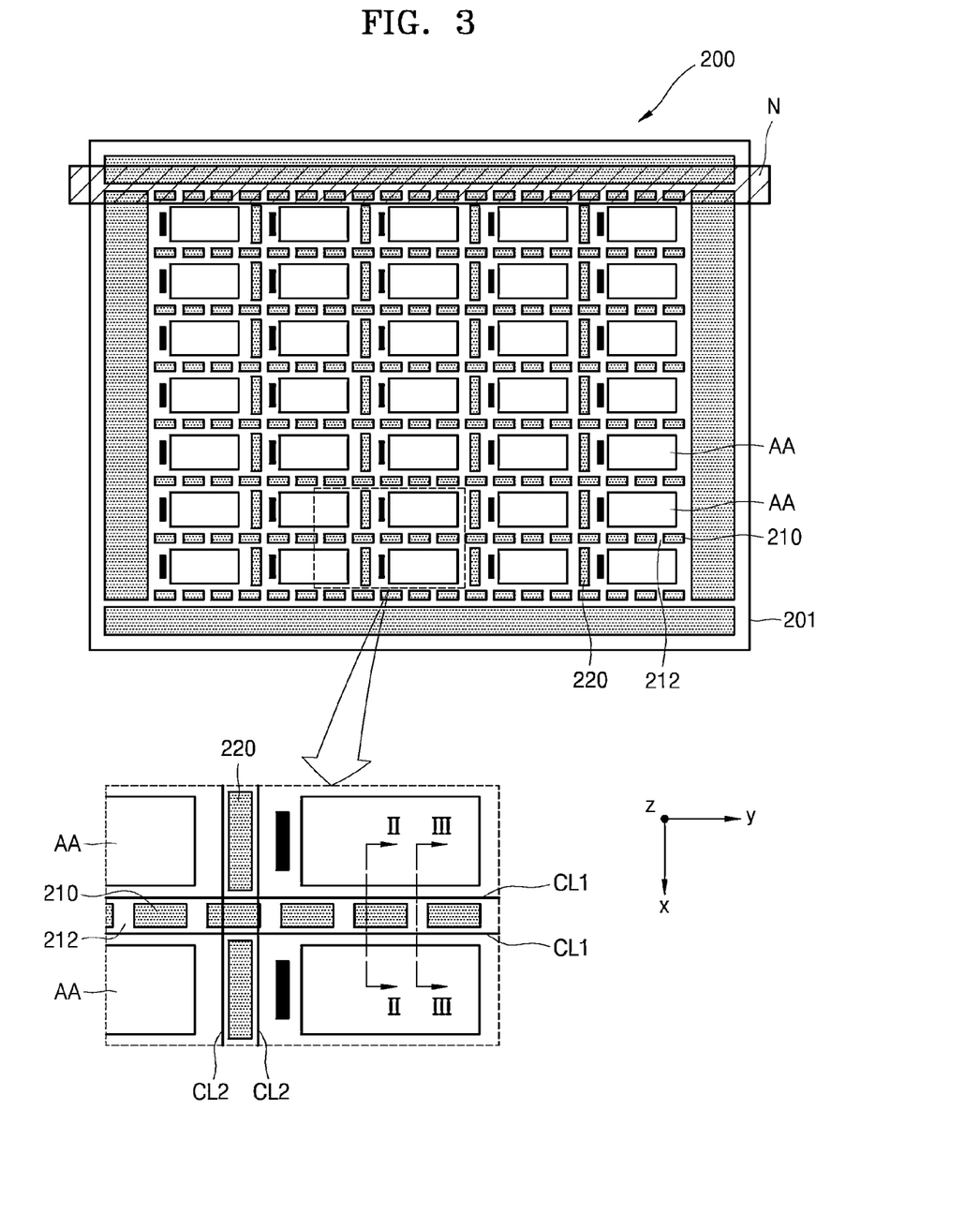
FIG. 3 is a plan view of a mother substrate for organic light-emitting display device, according to an embodiment of the present invention.
Figure 4:
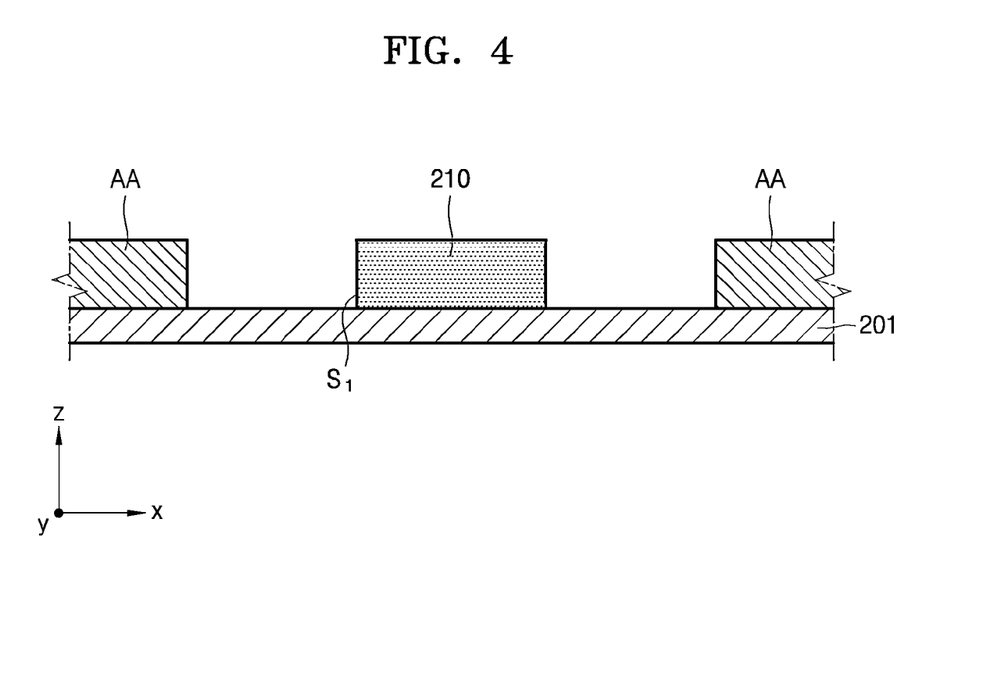
FIG. 4 is a cross-sectional view of the mother substrate for organic light-emitting display device, taken along a line II-II of FIG. 3.
Figure 5:
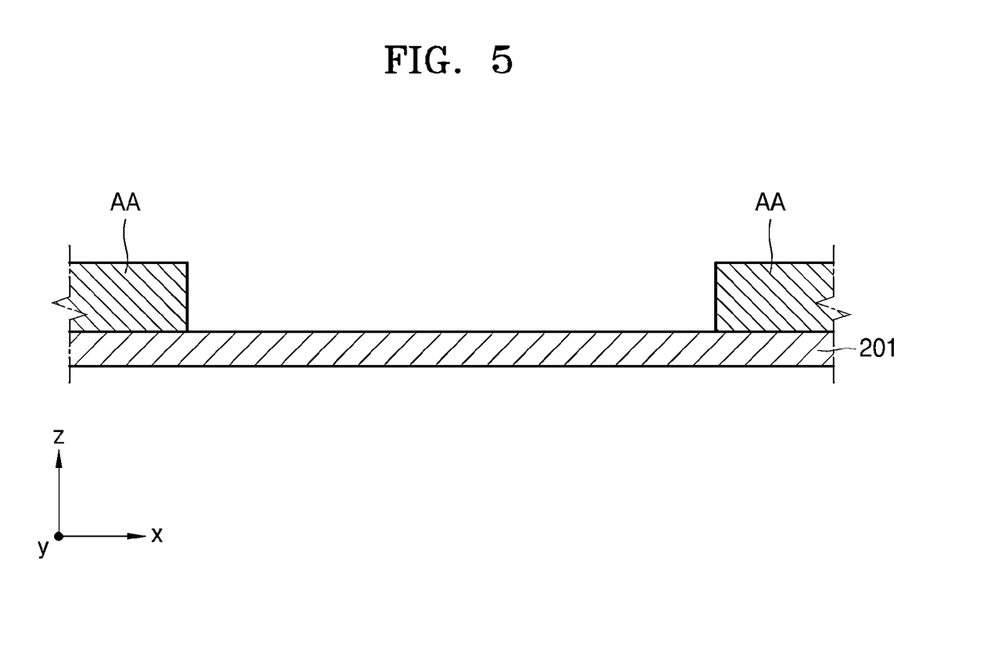
FIG. 5 is a cross-sectional view of the mother substrate for organic light-emitting display device, taken along a line III-III of FIG. 3.

FIG. 3 is a plan view of a mother substrate for organic light-emitting display device 200, according to another embodiment. FIG. 4 is a cross-sectional view of the mother substrate for organic light-emitting display device 200, taken along a line II-II of FIG. 3. FIG. 5 is a cross-sectional view of the mother substrate for organic light-emitting display device 200, taken along a line III-III of FIG. 3.

Referring to FIG. 3, the mother substrate for organic light-emitting display device 200 may include a base substrate 201 having a plurality of display areas AA defined thereon. A plurality of first dummy patterns 210 and a plurality of second dummy patterns 220 may be formed on the base substrate 201.

The base substrate 201 may be the same as or similar to the substrate 101 described with reference to FIG. 2.

The display areas AA may be arranged in a matrix having a first direction (e.g., an X-axis direction) and a second direction (e.g., a Y-axis direction), which are perpendicular to each other. For example, the first direction (e.g., the X-axis direction) may be parallel to a shorter side of each of the display areas AA, and the second direction (e.g., the Y-axis direction) may be parallel a longer side of each of the display areas AA.

FIG. 3 schematically illustrates how the pixel defining layer 119 (e.g., illustrated in FIG. 2) is formed in a process of manufacturing the organic light-emitting display device 100 (e.g., by using the mother substrate for organic light-emitting display device 200). Referring to FIG. 3, the pixel electrode 110 (e.g., illustrated in FIG. 2) has been formed on the display areas AA. Hereinafter, with reference to FIGS. 2 and 3, a method of manufacturing the organic light-emitting display device 100 will be described.

Referring to FIGS. 2 and 3, the TFT 100a is formed within each of the display areas AA defined on the base substrate 201, the planarization layer 109 is formed on the TFT 100a, and the OLED 100b is formed on the planarization layer 109.

In one embodiment, the buffer layer 102, the active layer 103, and the gate insulating layer 104 covering the active layer 103 are formed in each of the display areas AA that are defined on the base substrate 201, and then the gate electrode 105 is formed on the gate insulating layer 104. The buffer layer 102 and the gate insulating layer 104 may be formed on the entire surface of the base substrate 201.

The active layer 103 may be formed of amorphous silicon or polysilicon. The polysilicon may be formed by crystallizing the amorphous silicon. The amorphous silicon may be crystallized by using various methods including a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like.

The gate electrode 105 may be formed over the active layer 103 with the gate insulating layer 104 interposed therebetween. The active layer 103 may be doped with impurities by using the gate electrode 105 as a self align mask. For example, the active layer 103 may have a channel region at a position overlapping with the gate electrode 105, and a source region and a drain region that are doped with the impurities at both sides of the channel region.

Afterward, the interlayer insulating layer 106 is formed on the gate electrode 105, the power line 117, the source electrode 107, and the drain electrode 108 are formed on the interlayer insulating layer 106, and then the planarization layer 109 is formed over the source electrode 107 and the drain electrode 108. For example, the planarization layer 109 may cover the source electrode 107 and the drain electrode 108.

In one embodiment, the first dummy patterns 210 and the second dummy patterns 220 may be formed of the same material as the planarization layer 109. The first dummy patterns 210 may be disposed along the second direction between the rows formed by the display areas AA. The first dummy patterns 210 may extend beyond the edges of the array of the display areas AA. The second dummy patterns 220 may be disposed between adjacent display areas AA along the first direction (e.g., X direction in FIG. 3). Also, the first dummy patterns 210 may include a plurality of cut portions 212.

Afterward, the circuit line 116 that contacts the power line 117, and the pixel electrode 110 are formed on the planarization layer 109. The pixel defining layer 119 is formed on the pixel electrode 110.

The pixel defining layer 119 may be formed by a photoresist procedure. For example, as illustrated in FIG. 3, a nozzle unit N may spray an insulating solution to form the pixel defining layer 119 on an entire surface of the base substrate 201 and form an insulating layer as the nozzle unit N moves along the first direction (e.g., the X-axis direction) above the base substrate 201 where the display areas AA are arranged in the array. The insulating layer may be partially exposed by using a mask, and then the exposed region or a non-exposed region of the insulating layer may be patterned by etching.

Here, because the first dummy patterns 210 and the second dummy patterns 220 are formed between the display areas AA, when the exposing and etching processes are performed to form the pixel defining layer 119, a loading effect may be significantly decreased. Thus, the pixel defining layer 119 may be formed with a uniform pattern.

Also, the first dummy patterns 210 that are formed in a direction perpendicular to a movement direction of the nozzle unit N may include the cut portions 212. The cut portions may allow the pixel defining layer 119 to be formed with a uniform thickness.

FIG. 4 is a cross-sectional view of the mother substrate for organic light-emitting display device 200, taken along a line II-II of FIG. 3. Referring to FIG. 4, the first dummy pattern 210 is positioned between two adjacent display areas AA that are disposed along the first direction (e.g., the X-axis direction). If the first dummy patterns 210 did not include the cut portions 212, the first dummy patterns 210 may function as a dam. For example, when the insulating solution is sequentially sprayed on the base substrate 201 along the movement direction of the nozzle unit N, the insulating solution at a side surface S1 of the first dummy pattern 210 may be pushed in an opposite direction of a spray direction of the insulating solution. As a result, the insulating solution that is pushed in the opposite direction may end up in areas of the display area AA that the nozzle unit N has already passed, causing the pixel defining layer 119 to be formed with an uneven thickness. The uneven thickness may result in a spot may occur on the organic light-emitting display device 100. The aforementioned dam effect may be further increased as a gap between the display areas AA becomes narrow as more display areas AA are disposed on the mother substrate for organic light-emitting display device 200 so as to improve efficiency in manufacturing the organic light-emitting display device 100.

However, according to the one or more embodiments described in the present disclosure, the first dummy patterns 210 include the cut portions 212 so that the above-described problem may be solved. As illustrated in FIG. 5, the cut portion 212 is an area where the first dummy pattern 210 is partially removed or is not formed, and because the insulating solution, which is sprayed by the nozzle unit N as the nozzle unit N moves along the first direction (e.g., the X-axis direction), may easily move in the first direction (e.g., the X-axis direction) through the cut portions 212, uniformity in spraying the insulating solution may be improved. Thus, according to the one or more embodiments described in the present disclosure, even when more display areas AA are disposed on the mother substrate for organic light-emitting display device 200, the pixel defining layer 119 may be formed with a uniform thickness. Thus, the efficiency in manufacturing the organic light-emitting display device 100, and an image quality of the organic light-emitting display device 100 may be improved.

The cut portions 212 may be separated from each other by a regular distance but one or more embodiments are not limited thereto. For example, both edge portions of the base substrate 201 in the second direction (e.g., the Y-axis direction) have margins in which the sprayed insulating solution may move. On the other hand, the insulating solution may be limited to moving along the first direction (e.g., the X-axis direction) in a central portion of the base substrate 201. Thus, in one embodiment, the cut portion 212 formed in the central portion of the base substrate 201 may be larger than the cut portion 212 formed in the edge portions of the base substrate 201.

Referring to FIG. 3, the first dummy patterns 210 include the cut portions 212 but one or more embodiments are not limited thereto. For example, in a case where the nozzle unit N sprays an insulating solution for forming the pixel defining layer 119 as the nozzle unit N moves along the second direction (e.g., the Y-axis direction), the second dummy patterns 220 formed along the first direction (e.g., the X-axis direction) may include the cut portions 212.

Referring back to FIG. 2, after the pixel defining layer 119 is formed, the intermediate layer 112 and the common electrode 113 may be formed, an encapsulation member (not shown) may be formed on the common electrode 113 in a subsequent process. Subsequently, first cutting lines CL1 between the first dummy patterns 210 and the display areas AA, and second cutting lines CL2 between the second dummy patterns 220 and the display areas AA may be cut, so that the organic light-emitting display device 100 may be formed.

Figure 6:
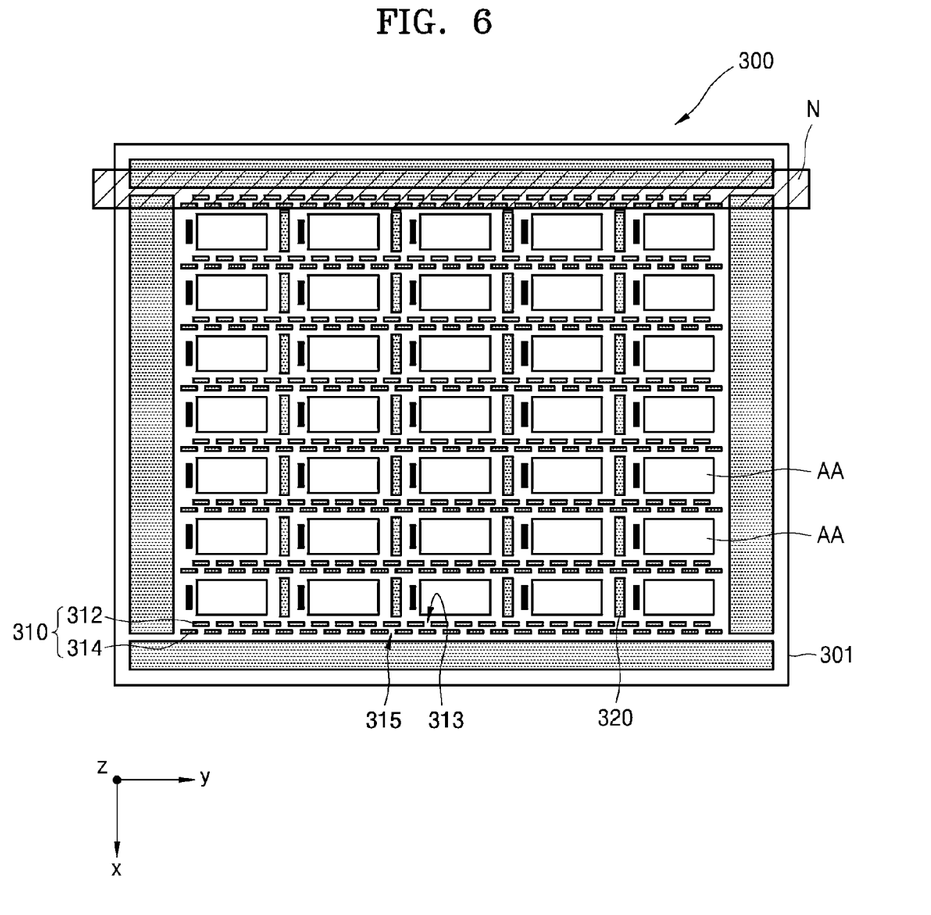
FIG. 6 is a plan view illustrating a modified example of the mother substrate for organic light-emitting display device of FIG. 3.

FIG. 6 is a plan view illustrating a modified example of the mother substrate for organic light-emitting display device 200 of FIG. 3.

Referring to FIG. 6, a mother substrate for organic light-emitting display device 300 may include a base substrate 301 having a plurality of display areas AA defined thereon. Additionally, the base substrate 301 may include a plurality of first dummy patterns 310 and a plurality of second dummy patterns 320 formed thereon.

Similar to the embodiment of FIG. 3, FIG. 6 schematically illustrates how the pixel defining layer 119 (e.g., shown in FIG. 2) is formed in a process of manufacturing the organic light-emitting display device 100 (e.g., by using the mother substrate for organic light-emitting display device 300). Thus, hereinafter, only the differences from the embodiment of FIG. 3 will be described with reference to FIG. 6.

The pixel defining layer 119 may be formed by a photoresist procedure in which a nozzle unit N sprays an insulating solution on the base substrate 301 as the nozzle unit N moves along a first direction (e.g., an X-axis direction). The insulating layer may be partially exposed using a mask, and then the exposed region or the non-exposed region of the insulating layer may be patterned by etching.

Here, each of the first dummy patterns 310 formed along a direction perpendicular to a movement direction of the nozzle unit N includes a first partition wall 312 and a second partition wall 314 that are parallel to each other. The first partition wall 312 and the second partition wall 314 may be separated from each other by a fixed or uniform distance. Also, the first partition wall 312 may include a plurality of cut portions 313, and the second partition wall 314 may include a plurality of cut portions 315.

The cut portion 313 and the cut portion 315 may alternate with each other. By doing so, a speed of the insulating solution that moves in the first direction (e.g., the X-axis direction) through the cut portions 313 and the cut portions 315 may be decreased, so that uniformity in spraying the insulating solution may be further improved.

Referring to FIG. 6, each of the first dummy patterns 310 includes the first partition wall 312 and the second partition wall 314, but one or more embodiments of the present invention are not limited thereto, thus, each of the first dummy patterns 310 may include at least three partition walls disposed in parallel to each other.

Figure 7:
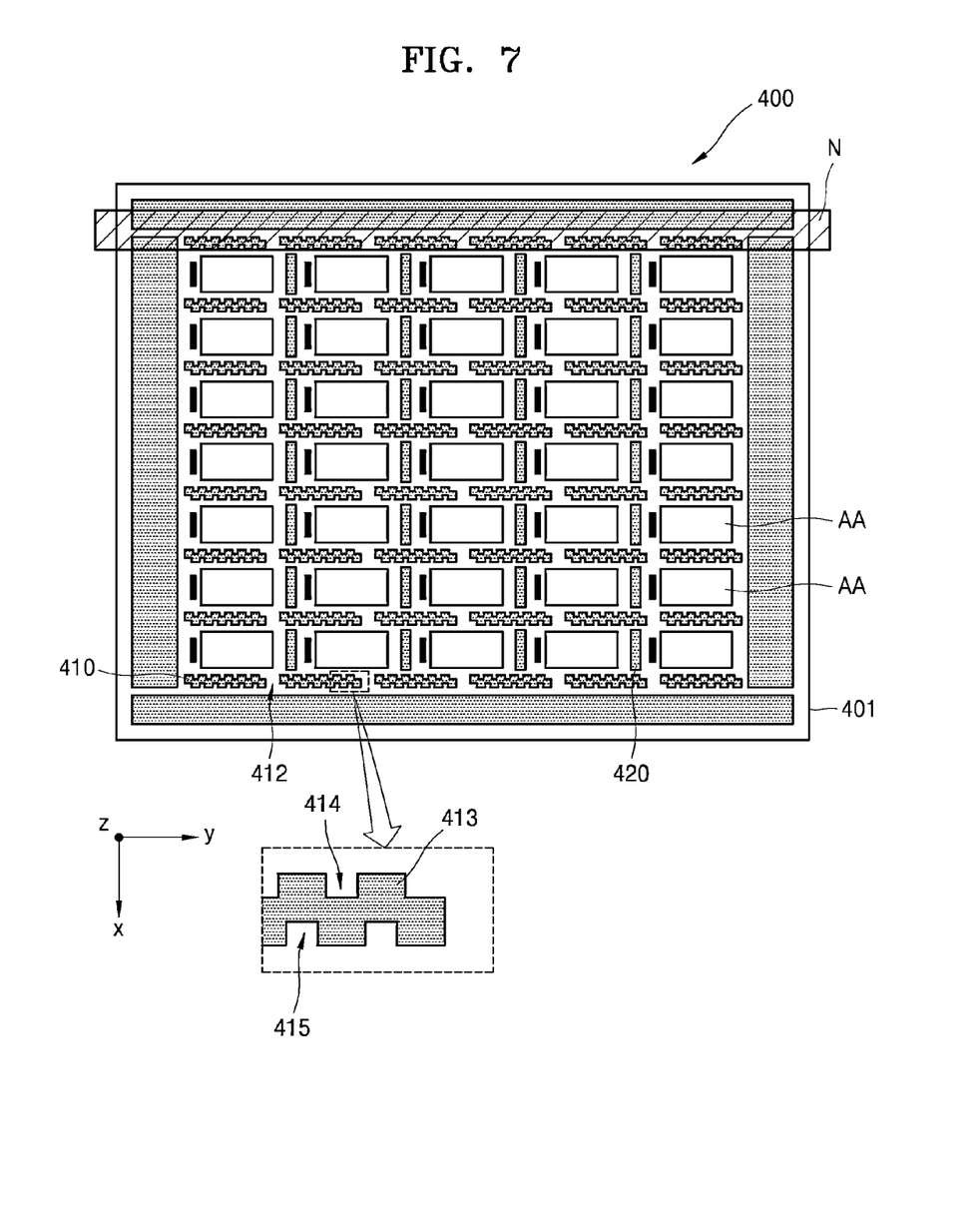
FIG. 7 is a plan view illustrating another modified example of the mother substrate for organic light-emitting display device of FIG. 3.

FIG. 7 is a plan view illustrating another modified example of the mother substrate for organic light-emitting display device 200 of FIG. 3.

Referring to FIG. 7, a mother substrate for organic light-emitting display device 400 may include a base substrate 401 having a plurality of display areas AA defined thereon. A plurality of first dummy patterns 410 and a plurality of second dummy patterns 420 may be formed on the base substrate 401.

Similar to the embodiment of FIG. 3, FIG. 7 schematically illustrates how the pixel defining layer 119 (e.g., shown in FIG. 2) is formed in a process of manufacturing the organic light-emitting display device 100 (e.g., by using the mother substrate for organic light-emitting display device 400). Thus, hereinafter, only the differences from the embodiment of FIG. 3 will be described with reference to FIG. 7.

The pixel defining layer 119 may be formed by a photoresist procedure in which a nozzle unit N sprays an insulating solution on the base substrate 401 as the nozzle unit N moves along a first direction (e.g., an X-axis direction). The insulating layer may be partially exposed using a mask, and then the exposed region or the non-exposed region of the insulating layer may be patterned by etching.

The first dummy patterns 410 formed along a direction perpendicular to a movement direction of the nozzle unit N include a plurality of cut portions 412, and as discussed above, such cut portions may improve the uniformity in spraying the insulating solution.

Also, each of the first dummy patterns 410 may include first concave portions 414 formed in a first side surface. Here, the first side surface means a surface that faces in a direction opposite to the movement direction of the nozzle unit N. When the first concave portions 414 are formed in the first side surface, the insulating solution that is sequentially sprayed by the nozzle unit N along the first direction (e.g., the X-axis direction) is first filled in the first concave portions 414 of the first dummy pattern 410, and therefore draws the insulating solution on side surfaces of convex portions 413 in both sides of the first concave portion 414, so that a surface tension between the insulating solution and the first dummy pattern 410 may be easily overcome. Thus, the insulating solution between the cut portions 412 may easily pass the first dummy patterns 410, and therefore uniformity in spraying the insulating solution may be improved.

The first dummy patterns 410 may further include second concave portions 415 formed in a second side surface opposite to the first side surface. In the example of FIG. 7, the second side surface refers to a surface of the first dummy patterns 410 that faces in the movement direction of the nozzle unit N. The second concave portions 415 and the first concave portions 414 may alternate with each other. For example, one second concave portion 415 is formed between a pair of the first concave portions 414. When the second concave portions 415 are further formed in the second side surface, a contact area between the first dummy pattern 410 and the insulating solution passing the first dummy pattern 410 is decreased so that the insulating solution may further easily pass the first dummy pattern 410.

According to the one or more of the above embodiments, efficiency in manufacturing the organic light-emitting display device, and an image quality of the organic light-emitting display device may be improved.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and detail may be made therein without departing from the spirit and scope of the present disclosure as defined by the following claims.

What is claimed is:

1. A mother substrate for an organic light-emitting display device, the mother substrate comprising:
   a base substrate;
   a plurality of display areas arranged in an array on the base substrate, the array having a plurality of rows extending in a row direction and a plurality of columns extending in a column direction perpendicular to the row direction, the plurality of rows comprising a first row and a second row immediately adjacent to the first row, the plurality of columns comprising a first column, wherein the first row comprises a first display area in the first column and the second row comprises a second display area in the first column such that the first and second display areas are immediately adjacent to each other;
   a plurality of first dummy patterns formed between each pairing of two immediately adjacent rows of the plurality of rows of the plurality of display areas; and
   a plurality of second dummy patterns formed between each pairing of two immediately adjacent columns of the plurality of columns of the plurality of display areas,
   wherein the plurality of first dummy patterns comprises one or more first dummy patterns interposed between the first and second display areas, and
   wherein the one or more first dummy patterns each comprises a first planar face facing the first display area and a second planar face facing the second display area and facing away from the first display area, wherein the first planar face is substantially planar and distanced from the first display area, wherein the second planar face is substantially planar and distanced from the second display area, the first and second planar faces spanning an entire length of the first dummy pattern in the row direction.

2. The mother substrate of claim 1, wherein at least one of the plurality of first dummy patterns extends beyond an edge of the array of the plurality of display areas in the row direction.

3. The mother substrate of claim 1, wherein each of the plurality of display areas comprises a thin-film transistor (TFT), a planarization layer formed over the TFT, and an organic light-emitting diode (OLED) electrically connected to the TFT through the planarization layer, and
   the plurality of first dummy patterns and the plurality of second dummy patterns are formed of the same material as the planarization layer.

4. The mother substrate of claim 1, wherein each of the plurality of first dummy patterns comprises a first partition wall and a second partition wall that are parallel to each other and are separated from each other by a predetermined distance.

5. The mother substrate of claim 4, wherein the first partition wall comprises a plurality of first cut portions, and the second partition wall comprises a plurality of second cut portions.

6. The mother substrate of claim 5, wherein the plurality of first cut portions and the plurality of second cut portions are formed alternately along a direction parallel to the rows of display areas.

7. The mother substrate of claim 1, wherein each of the plurality of first dummy patterns comprises a first side surface on one end thereof in a direction parallel to the columns of display areas, the first side surface having a plurality of first concave portions formed thereon.

8. The mother substrate of claim 7, wherein each of the plurality of first dummy patterns further comprises a second side surface on an opposite end of the first side surface in the direction parallel to the columns of display areas, the second side surface having a plurality of second concave portions formed thereon.

9. The mother substrate of claim 8, wherein the plurality of second concave portions and the plurality of first concave portions are formed alternately along a direction parallel to the rows of display areas.

10. The mother substrate of claim 1, further comprising first cutting lines between the plurality of first dummy patterns and the rows of the plurality of display areas, and second cutting lines between the plurality of second dummy patterns and the columns of the plurality of display areas.

11. A method of manufacturing an organic light-emitting display device, the method comprising:
   forming a thin-film transistor (TFT) within each of a plurality of display areas defined over a base substrate;
   forming a planarization layer over the TFT; and
   forming an organic light-emitting diode (OLED) over the planarization layer,
   wherein the plurality of display areas are arranged in an array on the base substrate, the array having a plurality of rows extending in a row direction and a plurality of columns extending in a column direction perpendicular to the row direction, the plurality of rows comprising a first row and a second row immediately adjacent to the first row, the plurality of columns comprising a first column, wherein the first row comprises a first display area in the first column and the second row comprises a second display area in the first column such that the first and second display areas are immediately adjacent to each other,
   wherein, in the forming of the planarization layer, a plurality of first dummy patterns are formed between each pairing of two adjacent rows of the plurality of rows of the plurality of display areas and a plurality of second dummy patterns are formed between each pairing of two adjacent columns of the plurality of columns of the plurality of display areas, using the same material as the planarization layer, wherein the plurality of first dummy patterns comprises one or more first dummy patterns interposed between the first and second display areas, and wherein the one or more first dummy patterns each comprises a first planar face facing the first display area and a second planar face facing the second display area and facing away from the first display area, wherein the first planar face is substantially planar and distanced from the first display area, wherein the second planar face is substantially planar and distanced from the second display area, the first and second planar faces spanning an entire length of the first dummy pattern in the row direction.

12. A method of manufacturing an organic light-emitting display device, the method comprising:

forming a thin-film transistor (TFT) within each of a plurality of display areas defined over a base substrate;

forming a planarization layer over the TFT; and forming an organic light-emitting diode (OLED) over the planarization layer, wherein the plurality of display areas are arranged in an array on the base substrate, the array having a plurality of rows and a plurality of columns that are perpendicular to the plurality of rows, wherein, in the forming of the planarization layer, a plurality of first dummy patterns are formed between the rows of display areas and a plurality of second dummy patterns are formed between the columns of display areas, using the same material as the planarization layer, wherein the plurality of first dummy patterns are spaced apart from each other by a plurality of cut portions, wherein the forming of the OLED comprises forming a pixel electrode over the planarization layer, and forming a pixel defining layer over the pixel electrode, wherein, in the forming of the pixel defining layer, a nozzle generates an insulating layer by spraying an insulating solution over the base substrate as the nozzle moves along a first direction, and the insulating layer is patterned, and wherein the plurality of first dummy patterns are formed in a direction perpendicular to the first direction.

13. The method of claim 12, wherein each of the plurality of first dummy patterns comprises a first partition wall and a second partition wall that are parallel to each other and are separated from each other by a predetermined distance.

14. The method of claim 13, wherein the first partition wall comprises a plurality of first cut portions, and the second partition wall comprises a plurality of second cut portions, and wherein the plurality of first cut portions and the plurality of second cut portions are formed alternately along the direction perpendicular to the first direction.

15. The method of claim 12, wherein each of the plurality of first dummy patterns comprises a first side surface that faces a direction opposite to a movement direction of the nozzle, the first side surface having a plurality of first concave portions formed thereon.

16. The method of claim 15, wherein each of the plurality of first dummy patterns further comprises a second side surface opposite to the first side surface, the second side surface having a plurality of second concave portions formed thereon, and wherein the plurality of second concave portions and the plurality of first concave portions are formed alternately along the direction perpendicular to the first direction.

17. The method of claim 12, further comprising cutting along first cutting lines between the plurality of first dummy patterns and the rows of the plurality of display areas, and cutting along second cutting lines between the plurality of second dummy patterns and the columns of the plurality of display areas.

* * * * *